United States Patent
Cordos et al.

(10) Patent No.: US 7,205,848 B2
(45) Date of Patent: Apr. 17, 2007

(54) SYSTEM AND METHOD FOR REDUCING THE LOCK TIME OF A PHASE LOCKED LOOP CIRCUIT

(75) Inventors: Ioan Cordos, Toronto (CA); Dorin E. Calbaza, Toronto (CA)

(73) Assignee: Gennum Corporation (CA)

( * ) Notice: Subject to any disclaimer, the term of this patent is extended or adjusted under 35 U.S.C. 154(b) by 15 days.

(21) Appl. No.: 10/931,747

(22) Filed: Sep. 1, 2004

(65) Prior Publication Data

US 2005/0156674 A1 Jul. 21, 2005

Related U.S. Application Data

(60) Provisional application No. 60/501,910, filed on Sep. 10, 2003.

(51) Int. Cl.
*H03L 7/16* (2006.01)

(52) U.S. Cl. .......................................... 331/16; 331/25

(58) Field of Classification Search ................... 331/16, 331/DIG. 2, 25
See application file for complete search history.

(56) References Cited

U.S. PATENT DOCUMENTS

| | | | |
|---|---|---|---|
| 4,931,748 A | 6/1990 | McDermott et al. | |
| 5,081,427 A | 1/1992 | Suarez | |
| 5,132,642 A | 7/1992 | Bush et al. | |
| 5,420,545 A | 5/1995 | Davis et al. | |
| 5,686,864 A * | 11/1997 | Martin et al. | 331/1 A |
| 5,757,240 A * | 5/1998 | Boerstler et al. | 331/34 |
| 5,874,863 A | 2/1999 | Wojewoda et al. | |
| 6,177,843 B1 | 1/2001 | Chou et al. | |
| 6,236,278 B1 | 5/2001 | Olgaard | |
| 6,392,497 B1 | 5/2002 | Takikawa | |
| 6,504,437 B1 | 1/2003 | Nelson et al. | |
| 6,566,966 B1 | 5/2003 | Bellaouar et al. | |
| 2002/0125961 A1 | 9/2002 | Jones et al. | |
| 2003/0020550 A1 | 1/2003 | Nelson et al. | |
| 2003/0050029 A1 | 3/2003 | Kaufmann et al. | |

OTHER PUBLICATIONS

Calbaza et al., "A Direct Digital Period Synthesis Circuit", Department of Electrical & Computer Engineering, Ecole Polytechnique de Montreal, Canada, pp. 1-8.

Calbaza et al., "An ADPLL Circuit Using a DDPS for Genlock Applications", Gennum Corporation, Burlington, Ontario, Canada, pp. 1-4.

* cited by examiner

*Primary Examiner*—Joseph Chang
(74) *Attorney, Agent, or Firm*—Jones Day

(57) ABSTRACT

In accordance with the teachings described herein, systems and methods are provided for reducing the lock time of a phase locked loop circuit. A phase comparator may be used to detect a phase error between an input reference signal and a feedback clock signal. A frequency synthesizer circuit may be used to control the frequency of an output clock signal as a function of the phase error between the input signal and the feedback clock signal. A feedback divider may be used to divide the frequency of the output clock signal to generate the feedback clock signal. A phase error monitor may be used to detect when the phase error between the input signal and the feedback clock signal reaches a peak value, and in response to detecting the peak value, initialize the feedback divider to reduce the phase error between the input signal and the feedback clock signal.

19 Claims, 7 Drawing Sheets

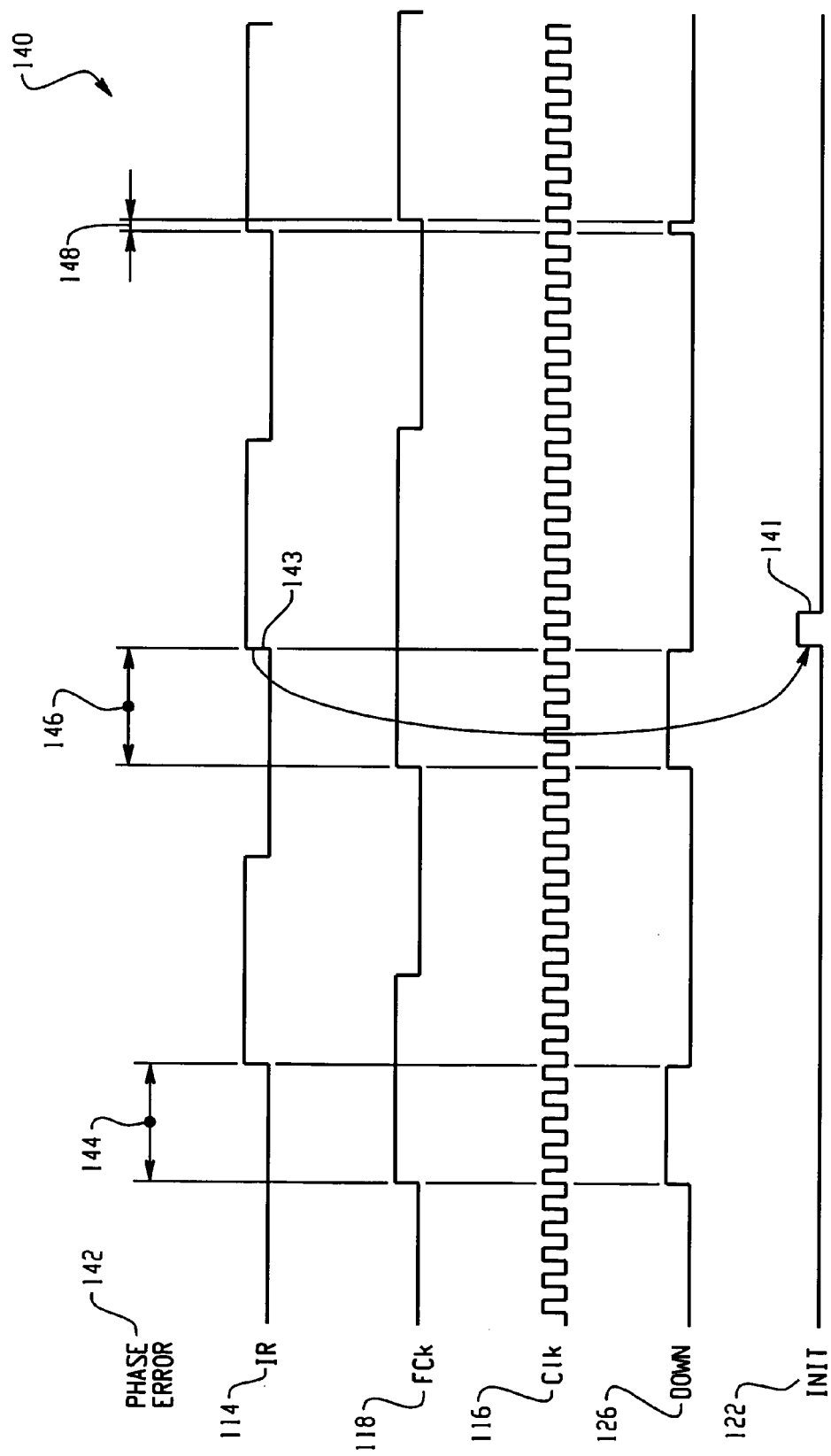

SYSTEM AND METHOD FOR REDUCING THE LOCK TIME OF A PHASE LOCKED LOOP CIRCUIT

CROSS-REFERENCE TO RELATED APPLICATION

This application claims priority from and is related to the following prior application: "Phased Locked Loop Locking System And Method," U.S. Provisional Application No. 60/501,910, filed Sep. 10, 2003. This prior application, including the entire written description and drawing figures, is hereby incorporated into the present application by reference.

FIELD

The technology described in this patent document relates generally to phase locked loops. More particularly, this patent document describes a system and method for reducing the lock time of a phase locked loop circuit.

BACKGROUND

Phased locked loop (PLL) circuits are commonly used to synchronize an output clock signal with an input reference signal. The lock time of a PLL circuit is the duration between the time when the PLL receives all input and control signals and the time when the output clock signal is locked into phase with the input reference signal. Typical PLL circuits may exhibit lock times having durations that are unsuitable for specific applications.

SUMMARY

In accordance with the teachings described herein, systems and methods are provided for reducing the lock time of a phase locked loop circuit. A phase comparator may be used to detect a phase error between an input reference signal and a feedback clock signal. A frequency synthesizer circuit may be used to control the frequency of an output clock signal as a function of the phase error between the input signal and the feedback clock signal. A feedback divider may be used to divide the frequency of the output clock signal to generate the feedback clock signal. A phase error monitor may be used to detect when the phase error between the input signal and the feedback clock signal reaches a peak value, and in response to detecting the peak value, initialize the feedback divider to reduce the phase error between the input signal and the feedback clock signal.

BRIEF DESCRIPTION OF THE DRAWINGS

FIGS. 8 and 9 are timing diagrams illustrating an example operation of the phase error monitor and PFBD of FIG. 7.

DETAILED DESCRIPTION

Figure 1:
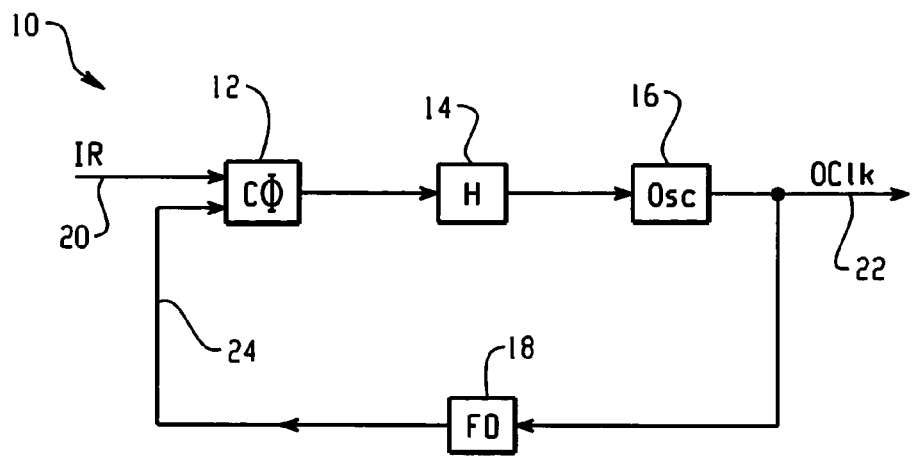
FIG. 1 is a block diagram of a typical phase locked loop (PLL) circuit.

With reference now to the drawing figures, FIG. 1 is a block diagram of a typical phase locked loop (PLL) circuit 10. The PLL 10 includes a phase comparator (CΦ) 12, a loop filter (H) 14, a controlled oscillator (Osc) 16 and a feedback divider (FD) 18. In operation, the output clock signal (OClk) 22 produced by the PLL 10 is divided by a fixed divide ratio in the feedback divider (FD) 18 and the resultant feedback clock signal 24 is compared with an input reference signal (IR) 20 by the phase comparator (CΦ) 12. The phase comparator (CΦ) 12 generates one or more phase error signals based on a phase difference between the input reference (IR) 20 and the feedback clock 24. The loop filter (H) 14 converts the one or more phase error signals from the phase comparator (CΦ) 12 into an analog control signal which controls the frequency of the output clock signal (OClk) 22 generated by the controlled oscillator 16.

The lock time of the typical PLL circuit 10 illustrated in FIG. 1 is dependent upon the frequency of the input reference signal (IR) 20, the fixed divide ratio of the feedback divider (FD) 18, and the operating parameters of the loop filter (H) 14 and controlled oscillator 16. The parameters of the phase comparator (CΦ) 12, loop filter (H) 14 and controlled oscillator (Osc) 16 may be optimized for a given application, however the frequency of the input reference signal (IR) 20 and the divide ratio of the feedback divider (FD) 18 are typically fixed values. Thus, the fixed divide ratio and input reference frequency of the PLL 10 typically dictate the lock time of the PLL 10.

Figure 2:
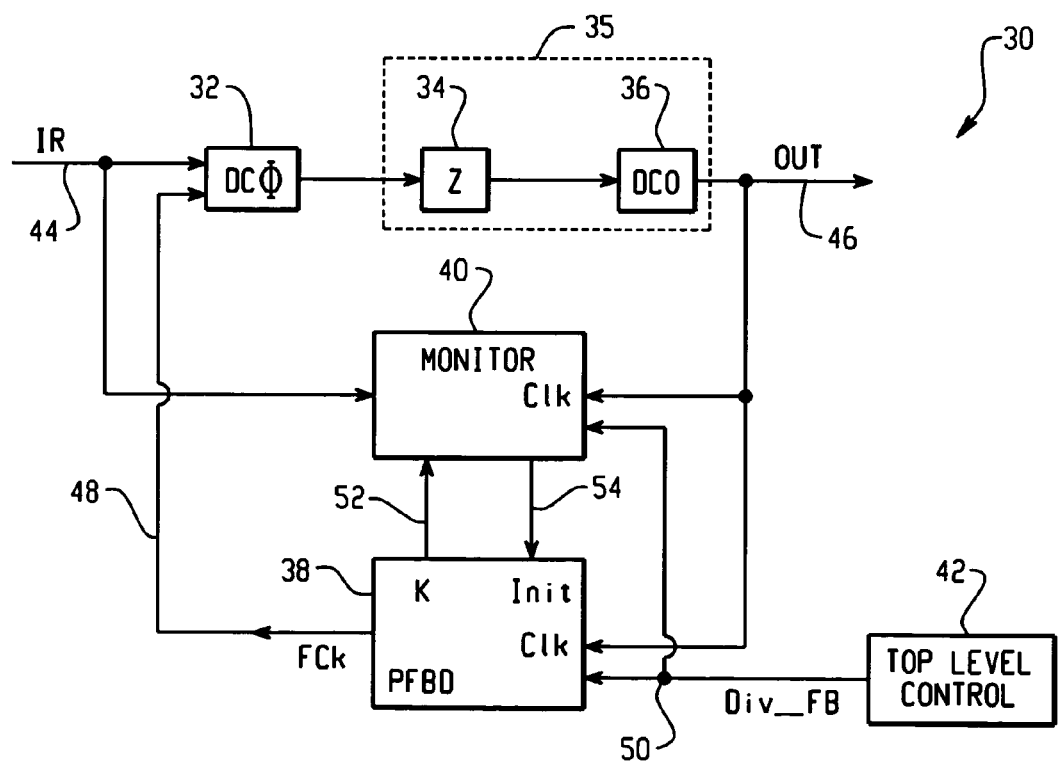
FIG. 2 is a block diagram of an example system for reducing the lock time of a PLL circuit.

FIG. 2 is a block diagram of an example system 30 for reducing the lock time of a PLL circuit. The example PLL circuit 30 includes a digital phase comparator (DCΦ) 32, a digital loop filter (Z) 34, a digital controlled oscillator (DCO) 36, a programmable feedback divider/counter (PFBD) 38, and a phase error monitor 40. Also illustrated is a control device 42 for setting the divide ratio (Div_FB) 50 of the PFBD 38. The control device 42 may, for example, be a microprocessor or other processing device, a user interface device, or some other suitable device or circuit for programming the PFBD 38 with the divide ratio (Div_FB) 50.

The digital phase comparator 32 is operable to detect a phase error between an input reference signal (IR) 44 and a feedback clock signal (FCk) 48. The phase comparator 32 may, for example, be a linear or non-linear phase detector circuit. An example non-linear phase detector circuit that may be used for the digital phase comparator 32 is described in the commonly-owned U.S. Pat. No. 6,614,314, entitled "Non-Linear Phase Detector," which is incorporated herein by reference. The output of the digital phase comparator 32 indicates whether the phase of the feedback clock signal 48 is leading or lagging the phase of the input reference signal 44. For example, in the case of a non-linear phase detector circuit, the digital phase comparator 32 may include an "UP" output to indicate that the feedback clock signal 48 is lagging the input reference signal 44 and a "DOWN" input to indicate that the feedback clock signal 48 is leading the input reference signal 44.

The digital loop filter (Z) 34 and controlled oscillator (DCO) 36 form a frequency synthesizer circuit 35 that generates the output clock signal 46 with a frequency controlled by the output of the phase comparator 32. The digital loop filter (Z) 34 converts the output of the phase comparator 32 into a control input to the controlled oscillator (DCO), which instructs the controlled oscillator (DCO) to either increase or decrease the frequency of the output clock signal 46. In one alternative embodiment, the frequency synthesizer circuit may include a charge pump circuit that converts the output of the phase comparator 32 into an analog signal to control the frequency of a voltage controlled oscillator. The output clock signal 46 is fed back to the programmable feedback divider/counter (PFBD) 38, which divides the output clock signal 46 by the divide ratio (Div_FB) 50 to generate the feedback clock signal 48. In addition, the PFBD 38 counts the periods of the output clock signal 46 to provide a counted value (K) 52 to the phase error monitor 40. The PFBD 38 may, for example, be implemented by a modulo counter, counting from 0 to Div_FB-1, and repeating from 0, unless an initialization signal (Init) sets it to a different state.

The phase error monitor 40 is operable to detect when the phase error between the input reference signal 44 and the feedback clock signal 48 reaches a peak value. When a peak phase error is detected, the phase error monitor 40 generates an initialization signal (Init) 54 to reset the PFBD 38. Resetting the PFBD 38 creates a jump in the phase of the feedback clock signal 48 to align or more closely align the phases of the feedback clock signal 48 and the input reference signal 44.

Figure 3:
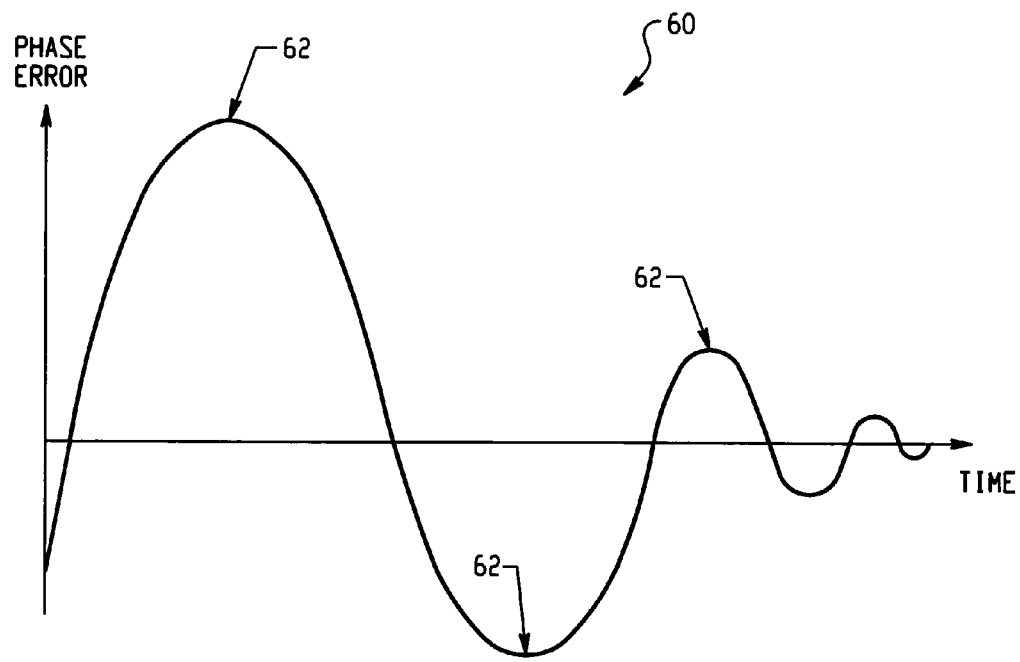
FIG. 3 is a graph illustrating a typical phase error detected by the example system of FIG. 2.
Figure 4:
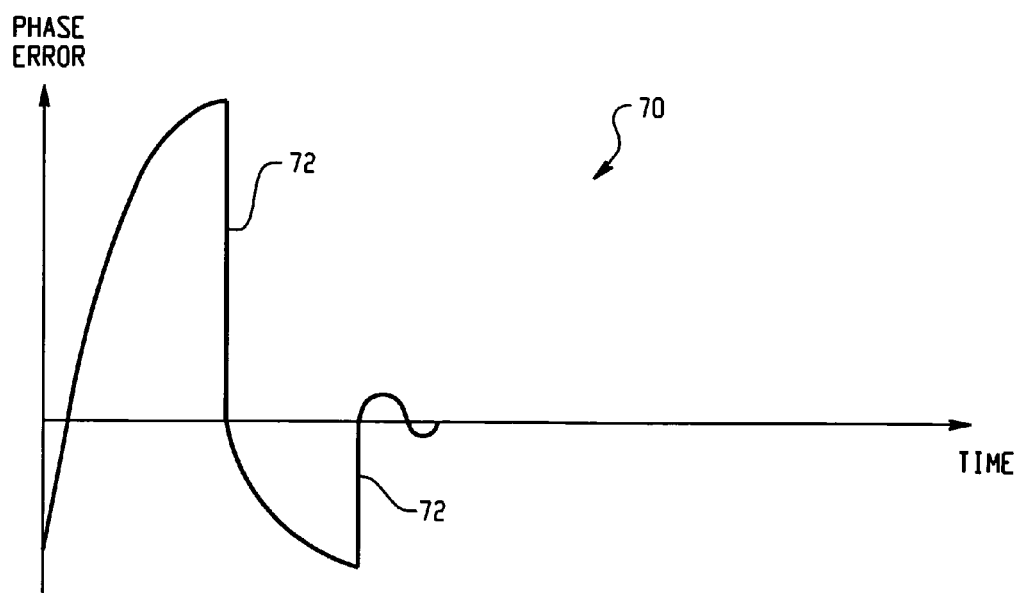
FIG. 4 is a graph illustrating an example operation of the system of FIG. 2.

A typical phase error 60 detected by the phase error monitor 40 between the input reference signal 44 and the feedback clock signal 48 is illustrated in FIG. 3. Assuming that the phase transfer function of the phase locked loop 30 is under-damped, the phase difference 60 between the input reference signal 44 and the feedback clock signal 48 will be an amortized sine wave, as illustrated in FIG. 3. At the peaks 62 of the amortized sine wave 60, the frequency of the feedback clock signal 48 is equal to (or very close to) the frequency of the input reference signal 44 and the phase error 60 is maximized. With reference to FIG. 2, the phase error monitor 40 sends an initialization signal 54 to the PFBD 38 upon detecting a phase error peak 62. When the PFBD 38 is initialized (reset), the phase error 70 between the feedback clock signal 48 and the input reference signal 44 is reduced to near zero, as illustrated in FIG. 4.

Ideally, when the phase error peaks, the frequency error between the signals 44, 48 is zero and only one PFBD 38 reset is needed to lock the PLL 30. However, because the accuracy of the phase error detection is determined by the period of the output clock signal 46 (which is greater than zero), several iterations may be necessary to lock the PLL, as illustrated in FIGS. 3 and 4. That is, it may be necessary to initialize the PFBD 38 more than once before the phase error is sufficiently reduced. With reference to FIG. 2, the number of iterations may, for example, be controlled by the control device 42. For example, the control device 42 may initiate a stop signal to the phase error monitor 40 after a pre-selected number of iterations, after a pre-selected period of time, or after a detection of a lock condition in the PLL circuit 30. For instance, in the example of FIG. 4, the control device initiates a stop signal after two iterations.

Figure 5:
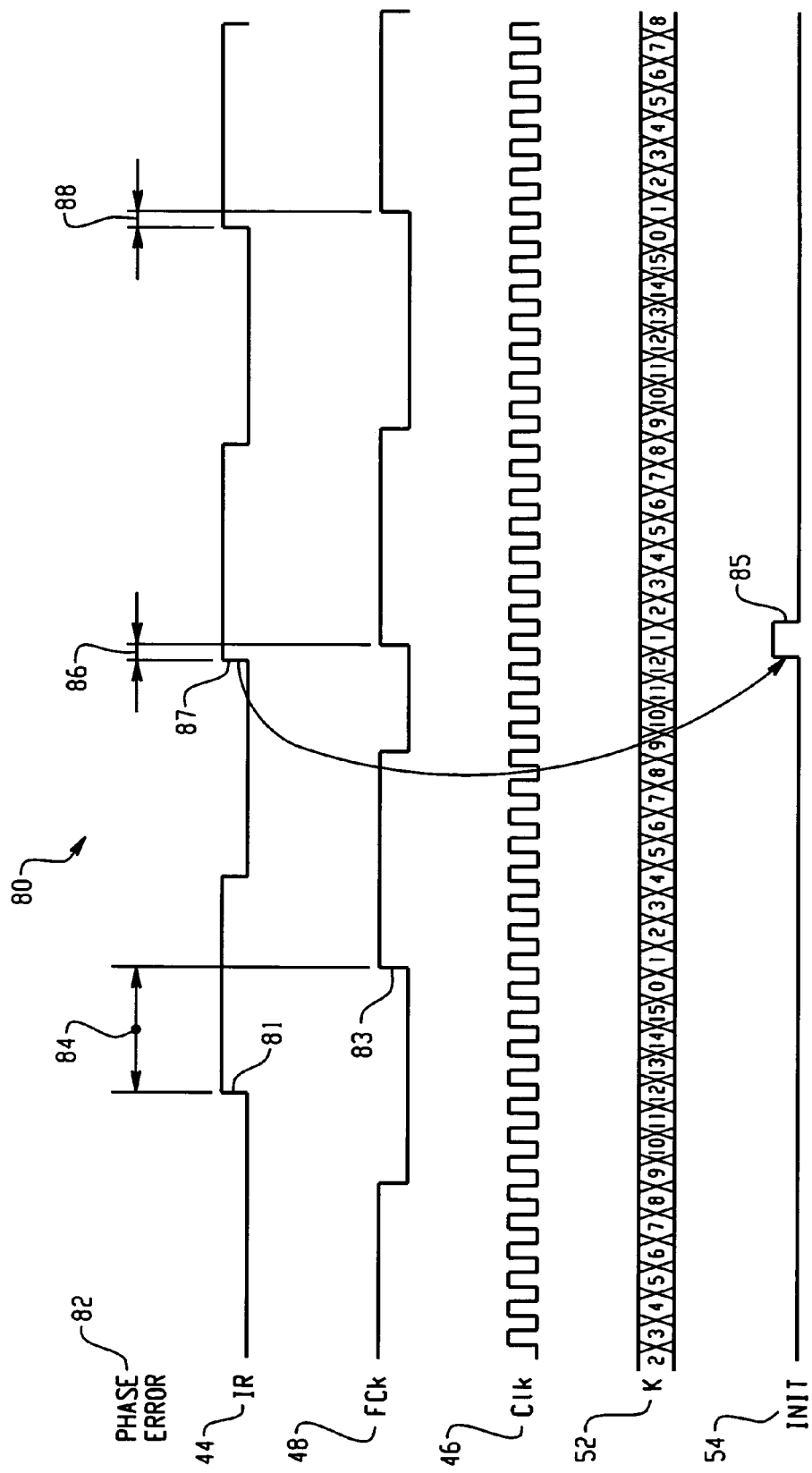
FIGS. 5 and 6 are timing diagrams illustrating an example operation of the phase error monitor and programmable feedback divider/counter (PFBD) of FIG. 2.
Figure 6:
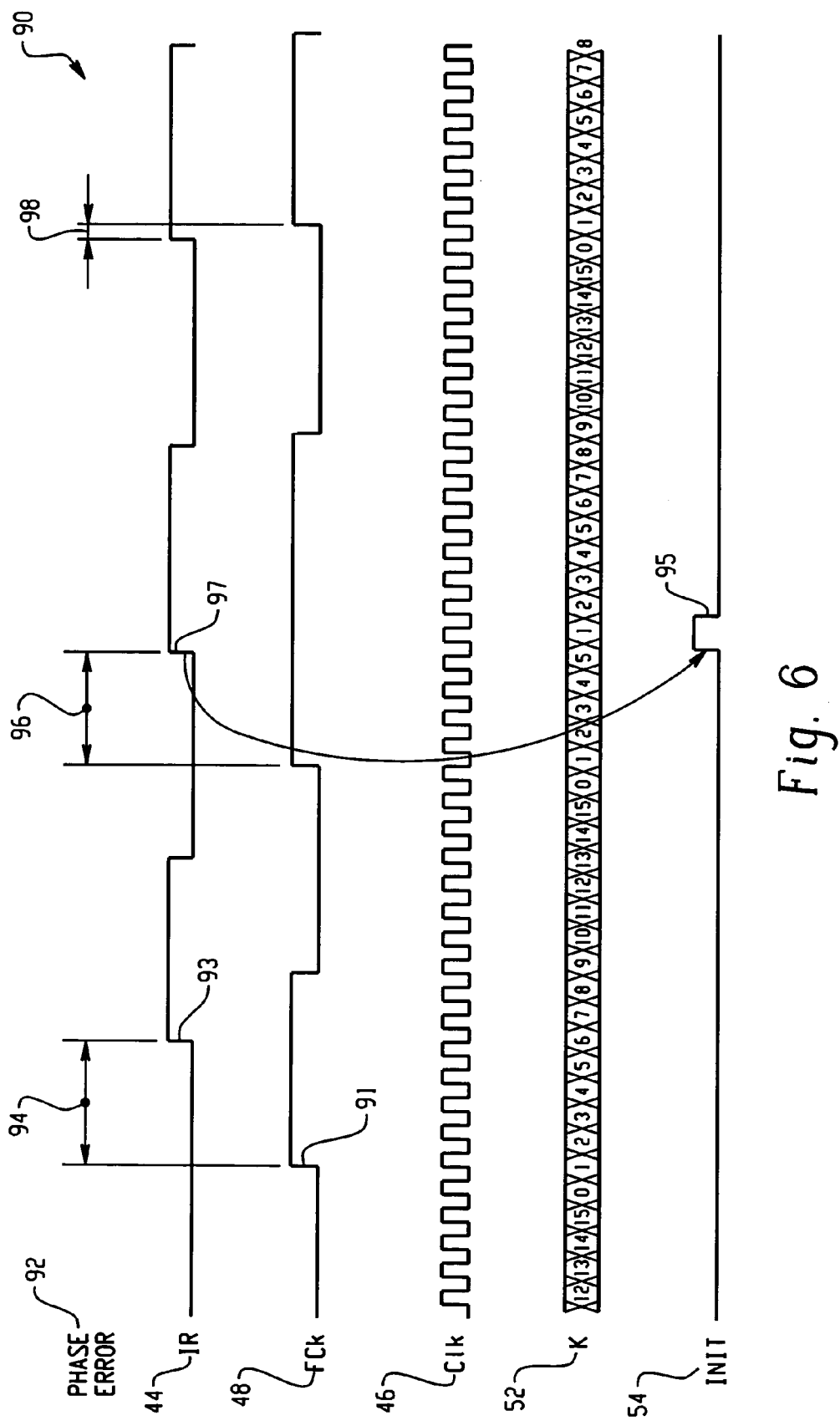

FIGS. 5 and 6 are timing diagrams illustrating an example operation of the phase error monitor 40 and PFBD 38 of FIG. 2. FIG. 5 illustrates an example operation 80 of the PLL circuit 30 when the feedback clock signal 48 is lagging the input reference signal (IR) 44, and FIG. 6 illustrates an example operation 90 of the PLL circuit 30 when the feedback clock signal 48 is leading the input reference signal (IR) 44.

With reference first to FIG. 5, a phase error 84 corresponding to four (4) clock cycles (K) is illustrated between the rising edge 81 of the input reference signal (IR) 44 and the rising edge 83 of the feedback clock signal 48. To identify a peak phase error 62, the phase error monitor 40 compares the value of the phase error 82 at each cycle of the feedback clock signal 48. The value of the phase error 82 may be measured by counting the number of clock cycles (K) 52 between the rising edges 81, 83 of the input reference signal (IR) 44 and the feedback clock signal 48. When the measured phase error 82 begins to decrease, a peak value has been reached. In the example of FIG. 5, a peak phase error is identified by the measured phase error 84 of four (4) clock cycles (K) because the previously measured phase error (not shown) had a value greater than four (4) clock cycles (e.g., 5 clock cycles).

Upon detecting a peak phase error 62, the phase error monitor 40 initializes the PFBD 38 by generating an initialization pulse 85 at the next rising edge 87 of the input reference signal (IR) 44. The initialization signal 85 in the illustrated example 80 causes the PFBD 52 to reset to a value of one (1), which resets the phase of the feedback clock signal 48. In this manner, the phase error 86 between the input reference signal (IR) 44 and the feedback clock signal 48 is reduced to less than one clock cycle. If a subsequent phase error 88 arises having a measured value equal to or greater than one clock cycle, then the phase error monitor 40 will again monitor the phase error to detect another peak value, and re-initialize the PFBD 38. It should be understood that in alternative embodiments the PFBD 52 could be initialized to a value other than one (1).

With reference now to FIG. 6, a phase error 94 corresponding to four (4) clock cycles (K) is illustrated between the rising edge 91 of the feedback clock signal 48 and the rising edge 93 of the input reference signal 93. As described above, the phase error monitor 40 identifies a peak phase error 62 by the measured phase error 94 of four (4) clock cycles (K) because the previously measured phase error (not shown) had a value greater than four (4) clock cycles. Upon detecting the peak phase error 62, the phase error monitor 40 generates an initialization pulse 95 at the next rising edge 97 of the input reference signal (IR) 44, causing the PFBD 52 to reset to a value of one (1) and thus resetting the phase of the feedback clock signal 48. After the PFBD 38 has been initialized 95, the measured phase error 98 at the next cycle of the feedback clock signal 48 is reduced to less than one clock cycle.

Figure 7:
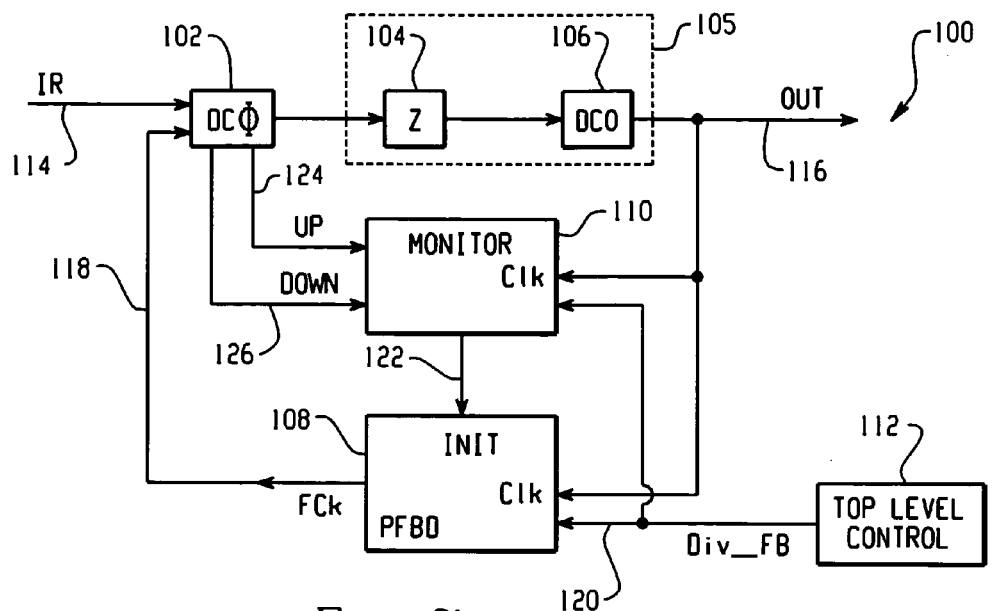
FIG. 7 is a block diagram of another example system for reducing the lock time of a PLL circuit.

FIG. 7 is a block diagram of another example system 100 for reducing the lock time of a phase locked loop (PLL) circuit. This example PLL circuit 100 is similar to the example described above with reference to FIG. 2, except that the phase error monitor 110 in this embodiment detects the phase error peaks directly from the output of the phase comparator 102. The phase comparator 102 in this embodiment 100 is a nonlinear phase detector having an "UP" output 124 that indicates that the feedback clock signal 118 is lagging the input reference signal (IR) 114 and a "DOWN" signal 126 that indicates that the feedback clock signal 118 is leading the input reference signal (IR) 126. The phase error monitor 110 uses the "UP" and "DOWN" signals 124, 126 to detect when the phase difference between the signals 114, 118 is at a peak value, as described below in more detail with reference to FIGS. 8 and 9. Once a peak phase error is detected, the phase error monitor 110 sends an initialization signal 112 to the PFBD 108 to bring the IR 114 and FCk 118 signals into alignment, as described above with reference to FIGS. 2–4.

Figure 8:
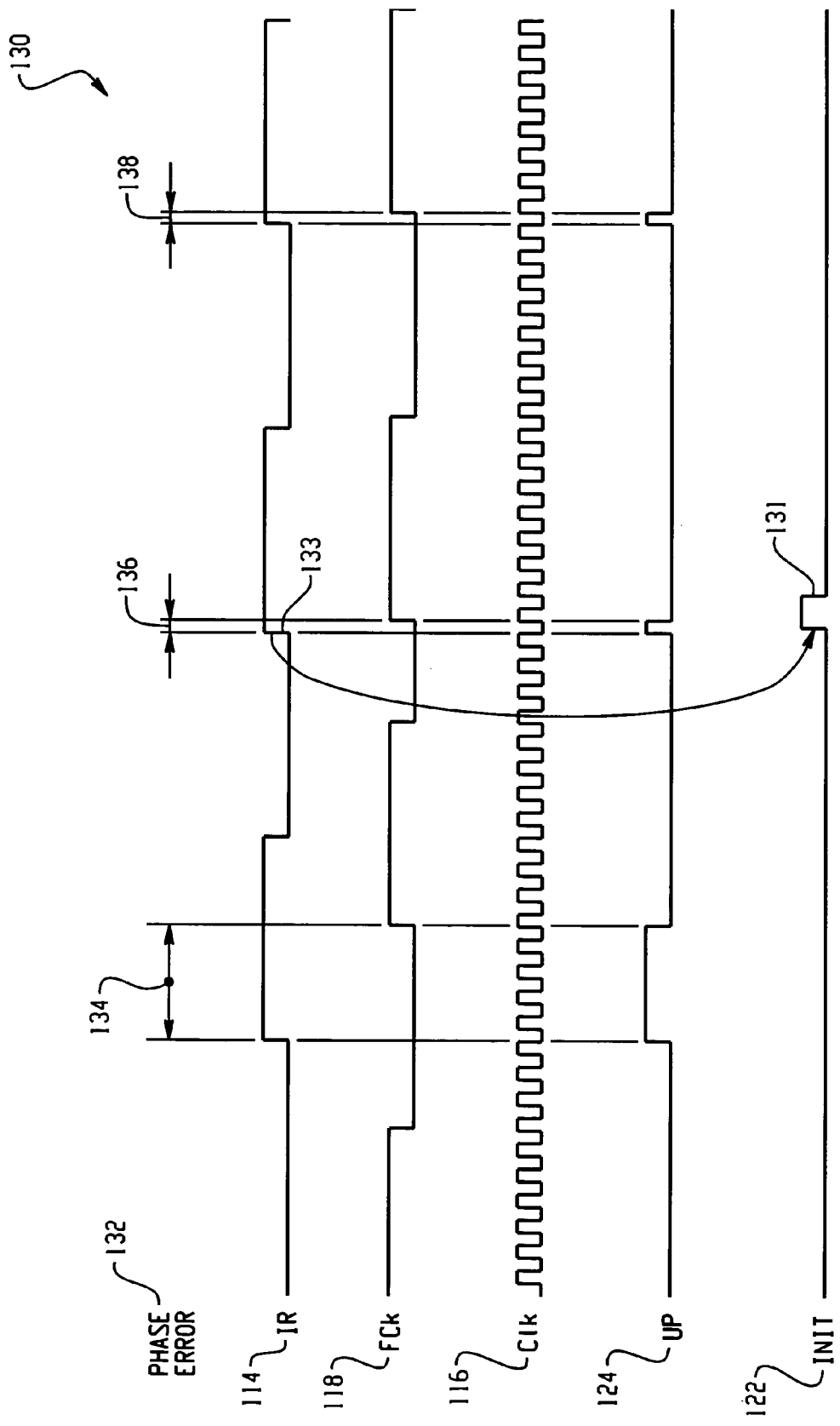

FIGS. 8 and 9 are timing diagrams illustrating an example operation of the phase error monitor 110 and PFBD 122 of FIG. 7. FIG. 8 illustrates an example operation 130 of the PLL circuit 100 when the feedback clock signal 118 is lagging the input reference signal (IR) 114, and FIG. 9 illustrates an example operation 140 of the PLL circuit 100 when the feedback clock signal 118 is leading the input reference signal 114.

With reference first to FIG. 8, a peak phase error 62 is detected between the feedback clock signal 118 and the input reference signal (IR) 114 by monitoring the length of the "UP" signal 124 from the phase comparator 102. When the length of the "UP" signal (e.g., measured in clock cycles 116) begins to decrease in value, a peak phase error 62 is detected. For instance, in the illustrated example 130, a peak phase error 62 is detected upon measuring a phase error 134 (i.e., the length of the "UP" signal) of four clock cycles in length because a previously measured phase error 132 (not shown) had a value greater than four clock cycles. Upon detecting a peak phase error 62, the phase error monitor 110 initializes the PFBD 108 by generating an initialization pulse 131 at the next rising edge 133 of the input reference signal (IR) 114. The initialization pulse 131 causes the PFBD 108 to reset, resetting the phase of the feedback clock signal 118 and reducing the phase error 136 to less than one clock cycle 116.

Similarly, with reference to FIG. 9, a phase error 144 corresponding to four (4) clock cycles is detected between the input reference signal (IR) 114 and the feedback clock signal 118 by monitoring the length of the "DOWN" signal 126 from the phase comparator 102. When the length of the "DOWN" signal (e.g., measured in clock cycles 116) begins to decrease in value, a peak phase error 62 is detected. In the illustrated example 140, a peak phase error 62 is detected upon measuring the phase error 144 of four (4) clock cycles because a previously measured phase error 142 (not shown) had a greater value. Upon detecting a peak phase error 62, the phase error monitor 110 initializes the PFBD 108 by generating an initialization pulse 141 at the next rising edge 143 of the input reference signal (IR) 114. Once the PFBD 108 has been initialized 141, the measured phase error 148 at the next cycle of the feedback clock signal 118 is reduced to less than one clock cycle 116.

Figure 10:
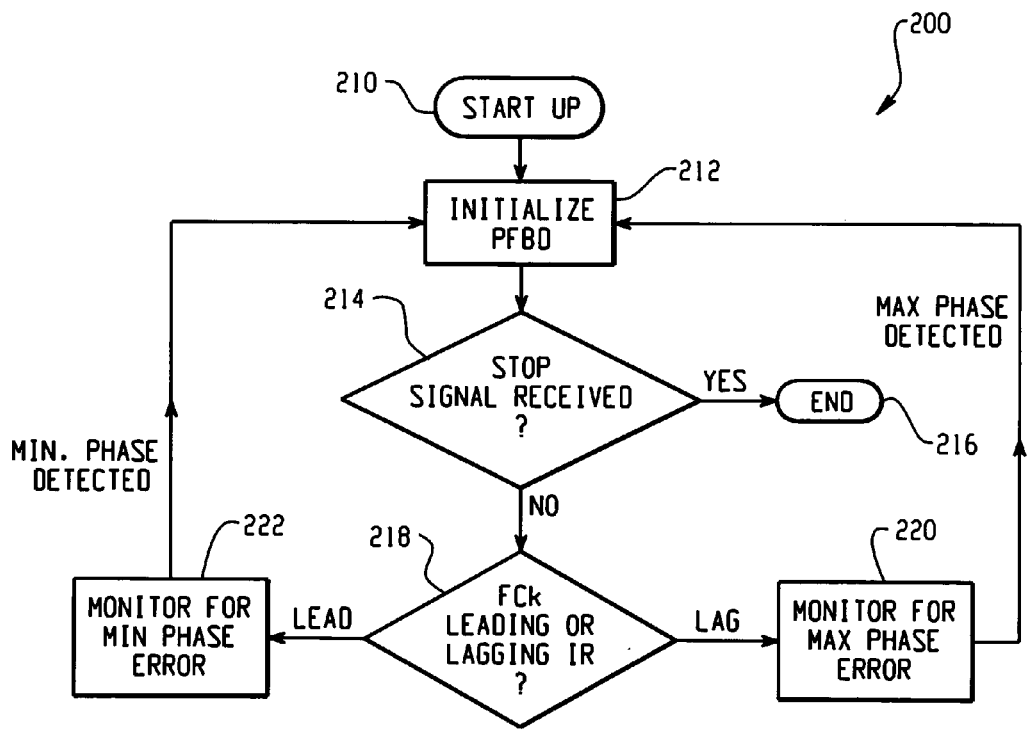
FIG. 10 is a flow diagram illustrating an example operational method for the phase error monitor of FIGS. 2 and 7.

FIG. 10 is a flow diagram illustrating an example operational method 200 for the phase error monitor 40, 110 of FIGS. 2 and 7. The method 200 begins at step 210 when the phase error monitor 40, 110 is powered. At step 212, the phase error monitor 40, 100 initializes the PFBD 38, 108. Then, at step 214, the method 200 determines if a stop signal has been received 214. A stop signal may, for instance, be received from a top level control device 42, 112, as described above. If a stop signal has been received, then the method 200 ends at step 216. Otherwise, if no stop signal has been received, then the method proceeds to step 218.

At step 218, the method determines if the phase of the feedback clock signal is leading or lagging that of the input reference signal (IR). If the feedback control signal is leading the input reference signal (IR), then the method proceeds to step 222. If the feedback control signal is lagging the input reference signal (IR), then the method proceeds to step 220.

At step 220, the method monitors for a maximum phase error. With reference to FIG. 3, a maximum phase error occurs at the positive peaks 62 of the amortized sine wave 60. The maximum phase error may, for example, be detected using one of the methods described above with reference to FIGS. 5 or 8. Once a maximum phase error has been detected at step 220, the method returns to step 212, and the PFBD is initialized.

At step 222, the method monitors for a minimum phase error. With reference to FIG. 3, a minimum phase error occurs at the negative peaks 62 of the amortized sine wave 60. The minimum phase error may, for example, be detected using one of the methods described above with reference to FIGS. 6 or 9. Once a minimum phase error has been detected at step 222, the method 200 returns to step 212, and the PFBD returns to step 212 and the PFBD is initialized.

This written description uses examples to disclose the invention, including the best mode, and also to enable a person skilled in the art to make and use the invention. The patentable scope of the invention may include other examples that occur to those skilled in the art. For example, other embodiments of the digital phase locked loop circuits 30, 100 illustrated in FIGS. 2 and 7 could be implemented using one or more analog components.

It is claimed:

1. A phase locked loop, comprising:
   a phase comparator operable to detect a phase error between an input reference signal and a feedback clock signal;
   a frequency synthesizer circuit operable to control the frequency of an output clock signal as a function of the phase error between the input signal and the feedback clock signal;
   a feedback divider operable to divide the frequency of the output clock signal to generate the feedback clock signal; and
   a phase error monitor operable to detect when the phase error between the input signal and the feedback clock signal reaches a maximum peak phase error value, and in response to detecting the peak phase error value, initialize the feedback divider to reduce the phase error between the input signal and the feedback clock signal.

2. The phase locked loop of claim 1, wherein the phase comparator generates one or more digital outputs corresponding to the phase error between the input reference signal and the feedback clock signal, and wherein the frequency synthesizer circuit comprises:
   a loop filter operable to convert the one or more digital outputs from the phase comparator into a control signal; and
   a controlled oscillator operable to generate the output clock signal, the controlled oscillator controlling the frequency of the output clock signal as a function of the control signal.

3. The phase locked loop of claim 1, wherein:
   the feedback divider counts the periods of the output clock signal occurring during each period of the feedback clock signal to generate a counted value signal; and
   the phase error monitor receives the counted value signal from the feedback divider and uses the counted value signal to detect the peak value of the phase error between the input signal and the feedback clock signal.

4. The phase locked loop of claim 1, wherein:
   the phase comparator generates one or more output signals corresponding to the phase error between the input reference signal and the feedback clock signal; and
   the phase error monitor receives the output signals from the phase comparator and uses the output signals to detect the peak value of the phase error between the input signal and the feedback clock signal.

5. The phase locked loop of claim 1, wherein the feedback divider is a programmable feedback divider that divides the frequency of the output clock signal by a divide ratio to generate the feedback clock signal.

6. The phase locked loop of claim 5, further comprising:
a control device operable to program the feedback divider with the divide ratio.

7. The phase locked loop of claim 6, wherein the control device is further operable to generate a stop signal to the phase error monitor that instructs the phase error monitor to stop initializing the feedback divider.

8. The phase locked loop of claim 7, wherein the phase error monitor generates the stop signal after the phase error monitor has initialized the feedback divider a pre-selected number of times.

9. The phase locked loop of claim 7, wherein the phase error monitor generates the stop signal after detecting a lock condition in the phase locked loop.

10. The phase locked loop of claim 7, wherein the phase error monitor generates the stop signal after a pre-selected period of time has elapsed.

11. The phase locked loop of claim 1, wherein the phase comparator is a linear phase detector circuit.

12. The phase locked loop of claim 1, wherein the phase comparator is a non-liner phase detector circuit.

13. A method for reducing the lock time of a phase locked loop circuit, the phase locked loop circuit including a feedback divider for dividing the frequency of an output clock signal to generate a feedback clock signal, the method comprising:
  detecting a phase error between an input reference signal and the feedback clock signal;
  monitoring the phase error to detect when the phase error reaches a maximum peak value; and
  upon detecting that the phase error has reached the peak value, initializing the feedback divider to reduce the phase error between the input reference signal and the feedback clock signal.

14. The method of claim 13, further comprising:
  determining if the feedback clock signal is leading or lagging the input reference signal;
  if the feedback clock signal is leading the input reference signal, then monitoring the phase error to detect when the phase error reaches a minimum value, and upon detecting that the phase error has reached the minimum value, initializing the feedback divider; and
  if the feedback clock signal is lagging the input reference signal, then monitoring the phase error to detect when the phase error reaches a maximum value, and upon detecting that the phase error has reached the maximum value, initializing the feedback divider.

15. The method of claim 13, further comprising:
repeating the steps of the method to achieve a feedback loop.

16. The method of claim 15, further comprising:
detecting a stop signal; and
in response to detecting the stop signal, discontinuing the step of repeating the steps of the method to achieve a feedback loop.

17. A phase locked loop, comprising:
means for detecting a phase error between an input reference signal and a feedback clock signal;
means for controlling the frequency of an output clock signal as a function of the phase error between the input signal and the feedback clock signal;
means for dividing the frequency of the output clock signal to generate the feedback clock signal; and
means for detecting when the phase error between the input signal and the feedback clock signal reaches a maximum peak phase error value, and in response to detecting the peak phase error value, initializing the frequency dividing means to reduce the phase error between the input signal and the feedback clock signal.

18. The phase locked loop of claim 17, further comprising:
means for programming the frequency dividing means with a divide ratio that is used by the frequency dividing means to generate the feedback clock signal.

19. The phase locked loop of claim 17, further comprising:
means far generating a stop signal that causes the phase locked loop to stop initializing the frequency dividing means.

* * * * *